United States Patent [19]

Jasper

[11] 4,350,951
[45] Sep. 21, 1982

[54] AUDIO ANALOG VOLTMETER

[75] Inventor: William J. Jasper, Escondido, Calif.

[73] Assignee: Burroughs Corporation, Detroit, Mich.

[21] Appl. No.: 106,473

[22] Filed: Dec. 26, 1979

[51] Int. Cl.$^3$ ............... G01R 19/00; G01R 19/165
[52] U.S. Cl. ............................. 324/133; 324/120
[58] Field of Search ............... 324/51, 52, 72, 72.5, 324/120, 133, 149, 157, 123 R, 123 C

[56] References Cited

U.S. PATENT DOCUMENTS

| | | | |
|---|---|---|---|
| 3,009,099 | 11/1961 | Muller | 324/52 |
| 3,742,351 | 6/1973 | Palmer et al. | 324/133 X |
| 3,786,468 | 1/1974 | Moffitt | 324/133 UX |
| 3,794,916 | 2/1974 | Ritzenthaler | 324/120 X |
| 3,872,384 | 3/1975 | Laass | 324/133 |
| 4,160,206 | 7/1979 | Bojarski | 324/133 X |
| 4,163,937 | 8/1979 | Laass | 324/133 X |

OTHER PUBLICATIONS

Majithia et al., *Design of an Audio Logic Tester*, IEEE Transactions on Instr. and Meas., vol. 1M-22, No. 1, Mar. 1973, pp. 95–97.

Hyan, J. T., *An Acoustic Digital Tester in Probe Form*, Funkschau, vol. 47, No. 15, p. 66, Jul. 18, 1975.

Butler, T. K., *Low-Priced Logic Probe Indicates Levels with Tones*, Electronics, vol. 48, No. 18, p. 118, Sep. 4, 1975.

Burmeister, H. G., Logic Probe Generates Square-Wave Test Pulses, EDN, vol. 22, No. 14, Aug. 5, 1977, p. 52.

*Primary Examiner*—Gerard R. Strecker
*Attorney, Agent, or Firm*—Charles J. Fassbender; Kevin R. Peterson

[57] ABSTRACT

Disclosed is an analog voltmeter which generates audible tones whose frequency is representative of the analog voltage being measured. Since voltage levels are detected through the sense of hearing, a user is not required to direct his visual attention to "read" the meter; but instead he can use his visual attention to place the meter's probe onto various nodes whose voltage is to be measured. Using the audio analog voltmeter on a five volt scale, frequency differences in the tone corresponding to 17 mv changes in the measured voltage are detectable.

8 Claims, 7 Drawing Figures

| CONDITION | VOLTAGE | FREQUENCY |
|---|---|---|
| NORMAL H | 3.8 V | $f_H$ |
| NORMAL L | 0.4 V | $f_L$ |
| BROKEN WIRE | 1.6 V | $f_{X1}$ |
| WEAK DRIVER | 1.2 V | $f_{X2}$ |

| FREQUENCY | SENSITIVITY @10dB | ΔV @ 5V SWEEP |
|---|---|---|
| 0.1 KHz | Δ 5.0 Hz | 12.5 MV |
| 0.5 KHz | Δ 5.5 Hz | 13.2 MV |
| 1.0 KHz | Δ 6.0 Hz | 15.0 MV |
| 2.0 KHz | Δ 7.0 Hz | 17.5 MV |

| CONDITION | VOLTAGE | FREQUENCY |
|---|---|---|
| NORMAL | 10 MV | $f_1$ |
| MISSING TR | 5 V | $f_2$ |

AUDIO ANALOG VOLTMETER

BACKGROUND OF THE INVENTION

This invention relates to electronic test equipment; and more particularly, to test equipment for debugging digital logic systems. Such systems typically are comprised of thousands of digital logic circuits which are interconnected via thousands of leads. One example of such a system is a digital computer.

The logic circuits in digital computers and other logic systems consist essentially of AND gates, OR gates, NAND gates, NOR gates, and INVERTERS. These gates may be implemented in a wide variety of ways, such as with $T^2L$ circuits, ECL circuits, etc. However, regardless of their particular implementation, they are all characterized under normal operating conditions as receiving input signals and generating output signals of only two voltage levels.

But when a logic gate becomes defective or when an interconnection between two logic gates is made improperly, then abnormal voltages are generated in the system. For example, abnormal voltages of 1.2 volts or 1.6 volts are often generated by such defects in $T^2L$ systems whose two normal voltage levels are 0.4 volts and 3.8 volts. These abnormal voltages cause the system to malfunction; and thus test equipment is required to locate the defect.

In the past, scopes and analog voltmeters have been used to locate these defects. But such equipment has been found unsatisfactory because the voltage levels that are sensed are displayed in a visual fashion. This is a problem because one must continually move his head back and forth from the node that is being probed to the visual display.

To fully appreciate this problem, it should be reiterated that typical logic systems contain thousands of logic gates and interconnections. And to track down an abnormal voltage level in such a system generally requires many of those gates to be probed. Thus, the back and forth head movement is not only an aggravation; but it also makes it very difficult to keep the probe on a particular node. Often, the probe will slip off the node; and with compact integrated circuits, each particular node is difficult to find.

Therefore, it is a primary object of the invention to provide improved test equipment.

Still another more specific object of the invention is to provide a meter which indicates the level of analog voltages in a non-visual fashion.

BRIEF SUMMARY OF THE INVENTION

These and other objects are accomplished in accordance with the invention by an analog voltmeter which generates audible tones whose frequency is representative of the analog voltage being measured. Since voltage levels are detected through the sense of hearing, the user is not required to direct his visual attention to "read" the meter; but instead he can use his visual attention to place the meter's probe onto various nodes whose voltage is to be measured. Using the audio analog voltmeter on a 5 volt scale, frequency differences in the tone corresponding to 17 mv changes in the measured voltage are detectable.

BRIEF DESCRIPTION OF THE DRAWINGS

Various features and advantages of the invention will best be understood by reference to the following detailed description and accompanying drawings wherein.

DETAILED DESCRIPTION

Figure 1:
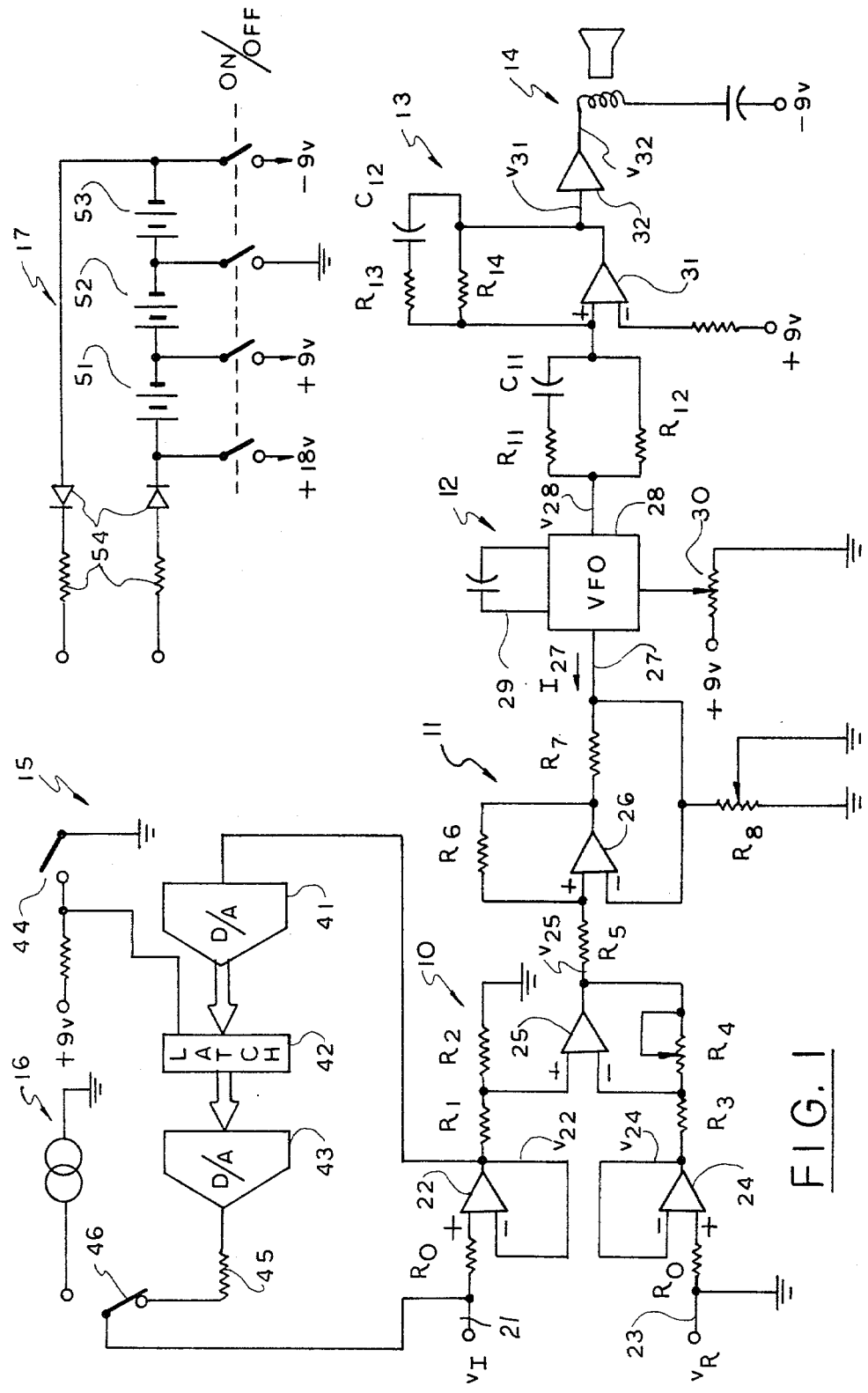
FIG. 1 is a detailed circuit diagram of one preferred embodiment of the invention.

Reference should now be made to FIG. 1 where a detailed circuit diagram of a preferred embodiment of the invention is illustrated. Some of the major modules in this embodiment are an input buffer 10, a voltage to current converter 11, a variable frequency oscillator 12, an audio amplifier 13, and a speaker 14. Basically, the operation of these modules is as follows.

First, input buffer 10 operates to generate an analog voltage V25 having a magnitude proportional to the level of an analog input voltage $v_I$ which is to be measured. Then, voltage to current converter 11 operates to generate an analog current whose magnitude is proportional to voltage V25. Oscillator 12 then operates to generate a sinusoidal voltage V28 whose frequency is representative of the magnitude of the current I.

Audio amplifier 13 then operates to amplify the various frequencies of which signal V28 may consist, in a predetermined non-uniform manner. Then speaker 14 operates to convert those amplified signals to audible tones. Since the tone's frequency is proportional to the magnitude of the input voltage $v_I$, the magnitude of the measured voltage may be preceived through the sense of hearing.

To understand how each of the modules 10–14 perform their above described respective functions, consider the following analysis. Module 10 includes a probe 21 for receiving input signal $v_I$. Probe 21 couples through a resistor Ro to the positive input of a high gain DC differential amplifier 22. This amplifier 22 is characterized as having a high input impedance (eq. $>10^8$ ohms) on both its plus and minus input terminals, and as operating to generate an output voltage V22 which forces the input voltages on its plus and minus terminals to be essentially equal to each other. Suitably, amplifier 22 may consist of an UA747 integrated circuit which is sold by Fairchild Corporation. Utilizing the above two characteristics of amplifier 22 in conjunction with the particular feedback which is illustrated, it can be shown that voltage V22 equals to the input voltage $v_I$ which is to be measured.

Also included in input buffer 10 is a probe 23 which provides a means for contacting a reference voltage $v_R$ for the input voltage $v_I$. For the sake of this analysis, $v_R$ may be considered to be zero volts or ground; however in actuality, the reference voltage may be of any value.

Probe 23 couples through a resistor Ro to the positive input of another high gain DC differential amplifier 24. Amplifier 24 is identical in construction to the above described amplifier 22. Also, it has its output fedback to its negative input, which thereby forces the amplifier's output voltage V24 to equal the reference voltage $v_R$.

Voltage V22 is coupled through a pair of resistors R1 and R2 to the positive input of still another high-gain DC differential amplifier 25; and voltage V24 is coupled through resistors R3 and R4 to the negative input of that amplifier. Again, amplifier 25 is identical in its construction to the above described amplifiers 23 and 26. Utilizing the above described characteristics of those amplifiers and treating the reference voltage $v_R$ as zero volts, it can be shown that the output voltage V25 of amplifier 25 may be expressed as:

$$V25 = \frac{R2(R3 + R4)}{R3(R1 + R2)} v_I.$$

Thus, by setting the value of resistors R1, R2, and R3 equal to some predetermined value R and by letting R4 vary about R, voltage V25 may be made to have a gain which is either less than 1 or greater than 1 depending soley on the value of R4. This is desirable because a gain of less than 1 enables the input voltage $v_I$ to be measured over a wide range with one sensitivity; whereas a gain of greater than 1 enables the input voltage to be measured over a smaller range with an increased sensitivity.

Voltage V25 is the input signal of the voltage to current converter 11. That converter includes a high-gain DC differential amplifier 26 which is of the same construction as the previously described amplifiers 22, 24, and 25. The inputs and outputs of amplifier 26 are interconnected with resistors R5, R6, R7, and R8 as illustrated in FIG. 1. Also, the output terminal 27 of converter 11 is coupled to a fixed voltage level of +3 volts which is generated internally within oscillator 12.

Utilizing the above described operating characteristics of amplifier 26 in conjunction with that amplifier's particular feedback network, it may be shown that the current I27 of terminal 27 can be expressed as:

$$I27 = \frac{R6 \times V25}{R7 \times R5} - \frac{3 \times R6}{R7 \times R5} + \frac{3}{R8}.$$

Preferably, the value of resistors R5, R6, and R7 is fixed at some predetermined value, and the value of R8 is a variable. This allows the magnitude of the second and third terms in the above expression to be adjusted, and thereby select the audible tone that indicates voltages V25 and $v_I$ equal zero.

Current I27 is drawn from the variable frequency oscillator circuit 12 which includes an XR-2206 monolithic function generator chip 28, a timing capacitor 29, and a variable resistor 30. Chip 28 is sold by XR Integrated Systems; and basically, it operates in conjunction with components 29 and 30 to produce a sinusoidal output signal V28 having a frequency f which is expressed by:

$$f(H_3) = \frac{320 \times I(ma)}{C(\mu f)}.$$

In this equation, C is the value of capacitor 29, and I is the value of current I27. Thus, by appropriately scaling the range of I through varying R4 and by chosing an appropriate value for C, all of the resulting frequencies of signal V28 will lie within the audible frequency spectrum.

Signal V28 has a magnitude which is essentially constant regardless of its frequency. That magnitude is determined by the value of resistor 30. Signal V28 is then processed by audio amplifier 13 to produce signal V31 which is of the same frequency as signal V28 but which has an amplitude that increases in the upper and lower portions of the audible frequency spectrum.

To that end, circuit 13 includes a high-gain DC differential amplifier 31, which again is of the same construction as the previously described differential amplifiers 22, 24, and 26. Signal V28 is coupled to the positive input of amplifier 31 through an input network which consists of resistors R11 and R12 and a capacitor C11. The output voltage V31 of amplifier 31 is fedback to the amplifier's positive input through a feedback network which consists of resistors R13 and R14 and a capacitor C12.

Based on the above described characteristics of amplifier 31 in conjunction with its particular input and feedback networks, the ratio V31/V28 may be expressed mathematically as:

$$\frac{V31}{V28} = \frac{R14(1 + j\omega C12 \times R13)(1 + j\omega C11 \times R11 + j\omega C11 \times R12)}{R12(1 + j\omega C11 \times R11)(1 + j\omega C12 \times R13 + j\omega C12 \times R14)}$$

Thus, the higher and lower frequencies within signals V28 may be amplified more than others by choosing appropriate values for the components R11, R12, R13, R14, C11, and C12. This is a desirable feature since the human ear is less sensitive to sound in the upper and lower portions of the audible frequency range than in the middle portion of that range; but that non-uniform sensitivity may be compensated for by increasing the loudness of the signal in the upper and lower portions of the spectrum.

Based on the above equation for V31/V28, it is apparent that the amplitude of signal V31 for the lowest frequencies will be R14/R12×V28. That amplitude will begin to decrease where $\omega \times C12 \times R13 + \omega \times C12 \times R14 = 1$. This decrease will continue until $\omega \times C11 \times R11 + \omega \times C11 \times R12 = 1$. At that frequency, the amplitude of V31 will level off and remain essentially constant until $\omega \times C12 \times R13 = 1$. There the amplitude will rise; and it will continue to do so until $\omega \times C11 \times R11 = 1$.

All of the frequencies of signal V31 are thereafter increased in power by an essentially uniform amount by a current amplifier 32. Suitably, this current amplifier is integrated into a single package, such as an LH0002 which is sold by National Semiconductor Corporation. The powered up signal V32 is then utilized to drive speaker 14.

Also included in the preferred embodiment of FIG. 1, are modules 15, 16, and 17. Module 15 operates to provide a selectable voltage to buffer circuit 10 whenever probe 21 is being moved from one node to another. It includes an analog to digital converter 41, a digital latch 42, and a digital to analog converter 43. Components 41, 42, and 43 respectively are a DATEL ADC-EK12B chip, a RCA CD40174B chip, and a DATEL DAC-HA12BC chip.

Any desired voltage may be stored in latch 42 by first placing probe 21 on a node in an external circuit which carries that voltage. From probe 21, the voltage is transmitted through amplifier 22 and changed to digital form by analog to digital converter 41. These digital signals are stored in latch 42 in response to the manual opening of a switch 44. The digital signals stay in latch 42 without any degradation until switch 44 is again closed and opened.

Digital to analog converter 43 changes the digital signals in latch 42 back to an analog form; and the analog signal is applied through a resistor 45 and a two position switch 46 back to probe 21. The value of resistor 45 is relatively high, such as 10 megohms. Thus, when probe 21 is placed on a relatively low impedance node whose voltage is to be measured, substantially all of the voltage output from digital to analog converter 43 is dropped across resistor 45. But when probe 21 is being moved from one node to another, the output voltage of digital to analog converter 43 is applied directly to the probe. This produces an audible tone which can be compared against the tones that are produced by the various voltages which are being measured.

Module 16 consists of a constant current source. Current from the module is selectively sent through switch 46 to probe 21. From there, the current is sent through the node of the external circuit that probe 21 is placed in contact with; and the resulting voltage which is generated produces an audible tone as has been described above. Thus, module 16 is useful in making measurements in passive external circuits which have no power supplies, or in active external circuits which are powered down.

All of the above described modules 10–16 are powered by module 17. It includes three rechargable batteries 51, 52, and 53 which are serially interconnected to an AC voltage rectifier circuit 54. This module is desirable since it allows the FIG. 1 embodiment to be operated in a portable fashion.

Figure 2:
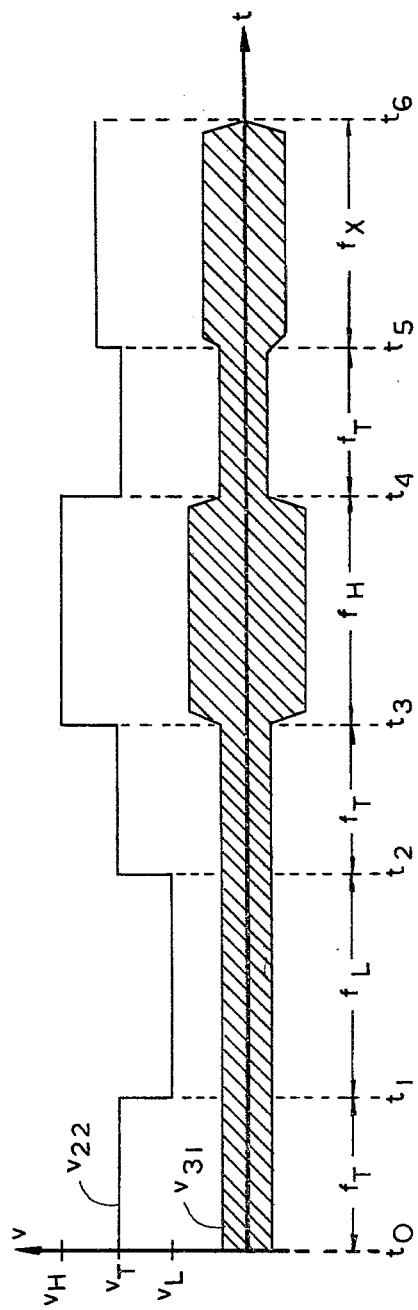
FIG. 2 is a timing diagram of various voltages which occur in the FIG. 1 embodiment.

Referring now to FIG. 2, an example of the signals V22 and V31 which were described above are illustrated as a function of time. In this example, probe 21 is placed during time interval $t_0$–$t_1$ onto the node of an external circuit which carries a voltage $v_T$ that is to be stored in latch 42. Voltage $v_T$ is illustrated as being a threshold level which lies approximately midway between a high logic level $v_H$ and a low logic level $v_L$. The storing operation is achieved by closing an then opening switch 44 as was described above.

Voltage $v_T$ is processed by modules 10, 11, 12, and 13 to produce signal V21 with a frequency $f_T$ which is representative of that voltage level. The actual value of frequency $f_T$ may be manually adjusted by means of the variable resistors R4 and R8 as was described above.

Thereafter during a time interval $t_1$–$t_2$, probe 21 is placed in contact with another node whose voltage is to be measured. In FIG. 2, the voltage of that node is indicated as the low logic level $v_L$. Voltage $v_L$ is then processed by modules 10, 11, 12, and 13 to produce signal V31 with a frequency $f_L$ which is characteristic of the low logic level.

Subsequently during time interval $t_2$–$t_3$, probe 21 is moved from the node which carries voltage $v_L$ to another node which carries voltage $v_H$. As probe 21 is being moved, voltage $v_T$ in latch 42 is transferred to probe 21; and modules 10–13 process that voltage to produce signal V31 with frequency $f_T$. Then at time instant $t_3$, when probe 21 makes contact with the node carrying voltage $v_H$, voltage V22 is made equal to voltage $v_H$; and modules 10–13 process voltage $v_H$ to produce signal V31 with a frequency $f_H$ which is characteristic of the high voltage level.

Note also as illustrated in FIG. 2, that the magnitude of signal V31 during the time interval $t_3$–$t_4$ is larger than the magnitude of signal V31 during the previous time intervals. This increase in magnitude is due to the action of audio amplifier 13. By increasing the amplitude of frequencies which lie in the upper portion of the audible spectrum more than the frequencies which lie in the lower portion of the spectrum, the ear's sensitivity to frequency changes is made more linear across the range of audible tones.

Next, during time interval $t_4$–$t_5$, probe 21 is moved to another node whose voltage is to be measured. Probe 21 reaches that node at time instant $t_5$. In FIG. 2, the new voltage level is illustrated as being neither a high logic level $v_H$ or a low logic level $v_L$. This abnormal voltage level is processed by modules 10–13 to produce signal V31 with a frequency $f_X$; and that frequency is recognizable by the ear as being different than the normal frequencies $f_T$, $f_L$, and $f_H$.

Figure 3:
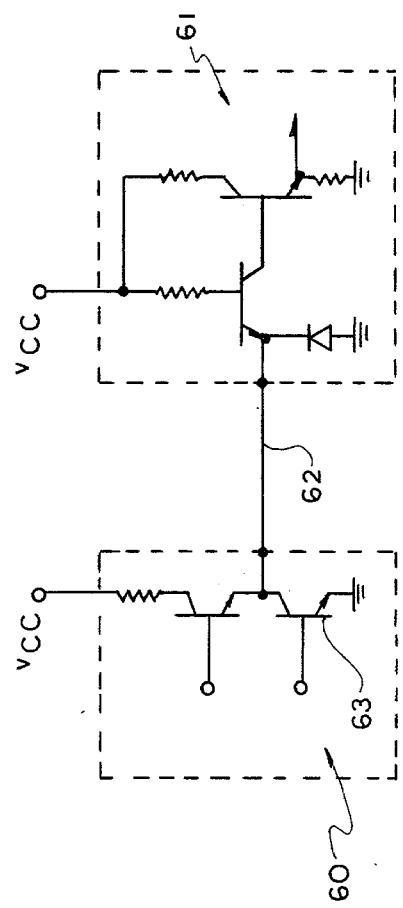
FIG. 3 is a diagram of a $T^2L$ circuit which can be tested with the FIG. 1 embodiment.
Figures 4, 5, 6, 7:
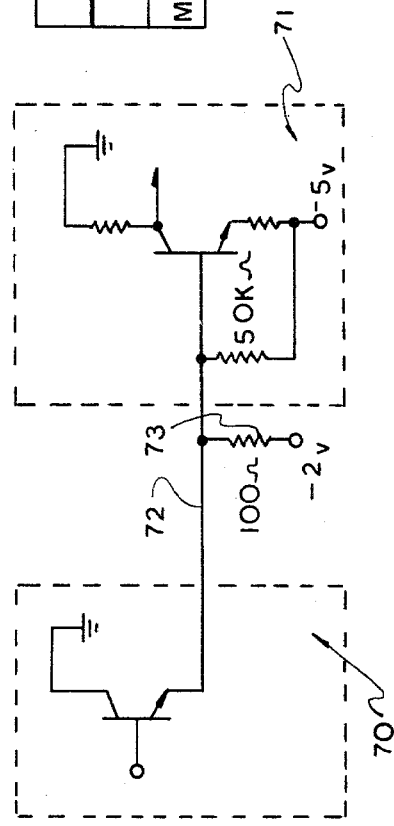
FIG. 4 illustrates various normal and abnormal voltage conditions which occur in the FIG. 3 circuit, and which are detected by the FIG. 1 embodiment.
FIG. 5 illustrates the FIG. 1 embodiment's sensitivity to voltage changes.
FIG. 6 is a diagram of an ECL circuit which can be tested by the FIG. 1 embodiment.
FIG. 7 illustrates various normal and abnormal voltage conditions which occur in the FIG. 6 circuit, and which can be tested by the FIG. 1 embodiment.

An example of some typical defective conditions which occur in T$^2$L logic circuits to cause abnormal voltages is indicated in FIGS. 3 and 4. In FIG. 3, the output stage of a T$^2$L driver is identified by reference numeral 60, and the input stage of a T$^2$L receiver is identified by reference numeral 61. These two stages 60 and 61 are interconnected via a lead 62 which probe 21 may be placed in contact with.

Under normal conditions, the voltage level of lead 62 is either 3.8 volts or 0.4 volts. This is indicated by the first two rows of entries in the Table of FIG. 4. However, one abnormal condition occurs when lead 62 breaks or otherwise makes poor contact with driver 60. This condition will cause the voltage level on the input of receiver 61 to be 1.6 volts. That voltage will be processed by modules 10–14 to produce an audible frequency $f_{X1}$ which is detectable by the ear as being different than the frequencies $f_H$ and $f_L$ that correspond to the normal voltage levels.

Similarly, another defective condition which may occur in the FIG. 3 circuit is that the driver transistor 63 becomes weak. Under those conditions, the low voltage on lead 62 will be above the normal low level, and typically is about 1.2 volts. This 1.2 volts is then processed by modules 10–14 to produce an audible frequency $f_{X2}$ which is detectable by the ear as being different than frequencies $f_H$, $f_L$, and $f_{X1}$.

A more quantitative analysis of the ear's ability to detect these abnormal voltages is given in FIG. 5. Data in the two left most columns of that figure was taken from a publication entitled "Reference Data for Radio Engineers", fifth edition, Howard W. Sams and Company, March 1970, page 35-19. Basically, those two columns show the ear's sensitivity to frequency changes in a signal whose volume is constantly 10 dB above the ear's threshold level. For example, the normal ear is able to detect frequency changes of 5 hertz in a 10 dB signal of 0.1 KHz; and is able to detect frequency changes of 7 hertz in a 10 dB signal of 2.0 KHz.

In the present invention, the above frequency changes which the ear can detect are translated to voltage changes on probe 21. Assume that the range of voltages which are to be applied to probe 21 is 5 volts; and that the corresponding range of frequencies in the audible spectrum is from 0.1 KHz to 2.0 KHz. Such a frequency range may be obtained in the FIG. 1 embodiment simply by adjusting resistors R4 and R8.

Next assume that the volume of speaker 14 is constantly 10 dB above the ear's threshold level. Then the smallest voltage change near 5 volts which the ear could sense would be $(5\times7.0)/2,000$ which equals 17.5 millivolts. Generally, a sensitivity of 17.5 millivolts is more than sufficient for trouble shooting most logic problems. For example, in the problems depicted in FIG. 4, the various voltages differ from each other by hundreds of millivolts.

Similarly, the smallest voltage change near 0 volts which the ear could sense would be $(5\times5.0)/2,000$ which equals 12.5 millivolts. These and other values are listed in the rightmost column of FIG. 5. Those listed values are relatively constant because the audible tone was selected above to vary only from 0.1 KHz to 2.0 KHz. Had the entire audible frequency spectrum been used, then the sensitivity would be much more non-linear. For example, at 10,000 Hz, the normal ear is able to detect frequency changes of only 80 Hz; and on a 5.0 volt scale, this corresponds to a voltage change of 40 mv.

Referring now to FIGS. 6 and 7, an example of how constant current module 16 is utilized in conjunction with modules 10–14 to detect various abnormal conditions will be described. In FIG. 5, reference numeral 70 indicates the output stage of an ECL driver; and reference numeral 71 indicates the input stage of an ECL receiver. These stages are interconnected via a lead 72 which has a termination resistor 73 attached thereto. Such terminating resistors are typically required in ECL circuits in order to prevent voltage waveforms from reflecting back and forth along line 72.

However, one abnormal condition which occurs in ECL circuits is that the terminating resistor 73 is left off or is otherwise not making contact with lead 72. This condition can readily be detected by removing power from the ECL circuit, and by placing probe 21 in contact with the lead 72. If the terminating resistor 73 is present, then the voltage which is produced on lead 72 by current source 16 will be relatively small, such as 10 millivolts. That voltage will then be processed by modules 10–14 to produce an audible frequency $f_1$. By comparison, if resistor 73 is missing, then the voltage that is produced on lead 72 will be substantially greater than 10 millivolts, since it is determined by the input impedance of receiver 71 which typically is 50 k ohms. This higher voltage will be processed by modules 10–14 to produce another audible tone of frequency $f_2$ which is readily distinguishable from frequency $f_1$.

A preferred embodiment of the invention, as well as its application, has now been described in detail. In addition, many changes and modifications may be made to these details without departing from the nature and spirit of the invention. Thus, it is to be understood that the invention is not limited to said details but as defined by the appended claims.

What is claimed is:

1. An electrical instrument for measuring any input voltage level through the sense of hearing, said instrument being comprised of:
    means for amplifying said input voltage with a manually selectable gain to form a first signal that is an analog of said input voltage and determines the range over which said input voltage is measured;
    means for generating a second signal having a component proportional to said first signal and having another component of a manually selectable constant magnitude that determines the audible tone corresponding to any single voltage in said range, said generating means including means for manually selecting said constant magnitude;
    means for converting said second signal into an audible tone with a frequency that is the analog of the magnitude of said second signal.

2. An instrument according to claim 1 and further including:
    sample and hold means and a manual switch means coupled to said means for amplifying, for selectively sampling and holding any input voltage received by said amplifying means in response to said manual switch; and
    means for automatically and instantaneously coupling said sampled and held voltage back to said means for amplifying whenever said means for amplifying is not receiving any input voltage;
    whereby said electrical instrument automatically and instantaneously generates an audible tone representative of said sampled and held voltage whenever said means for amplifying is not receiving any input voltage.

3. An instrument according to claim 2, wherein said means for converting includes means for amplifying all tones in the upper and lower portions of the audible frequency spectrum by a greater amount than in the center portion of said spectrum.

4. An instrument according to claim 2 and further including a probe means for coupling a resistance to said means for amplifying; and
    a means for supplying a constant current through said probe means to generate a voltage across said resistance which is proportional to said resistance;
    whereby said instrument generates an audible tone in response to said voltage across said resistance with a frequency that is the analog of said resistance.

5. An instrument according to claim 2 and further including a battery means for enabling said instrument to operate in a portable fashion.

6. An instrument according to claim 2 wherein said first signal formed by said means for amplifying is a voltage signal, and said second signal formed by said means for generating is a current signal.

7. A method for measuring any input voltage level through the sense of hearing, said method including the steps of:
    amplifying said input voltage with a manually selectable gain to form a first signal that is an analog of said input voltage and determines the range over which said input voltage is measured;
    generating a second signal having a component proportional to said first signal and having another component of a manually selectable constant magnitude that determines the audible tone corresponding to any single voltage in said range;
    converting said second signal into an audible tone with a frequency that is the analog of the magnitude of said second signal.

8. A method according to claim 7 and further including the steps of:
    selectively sampling and holding any input voltage received by said amplifying means in response to a manual switch; and
    automatically and instantaneously coupling said sampled and held voltage back to said means for amplifying whenever said means for amplifying is not receiving any input voltage;
    whereby an audible tone representative of said sampled and held voltage is automatically and instantaneously generated whenever no input voltage is present to amplify.

* * * * *